(12) United States Patent
Choi et al.

(10) Patent No.: US 9,076,745 B2
(45) Date of Patent: Jul. 7, 2015

(54) ORGANIC LIGHT EMITTING DISPLAY DEVICE AND METHOD FOR MANUFACTURING THE SAME

(75) Inventors: Hee Dong Choi, Seosan-si (KR); Seung Joon Jeon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 594 days.

(21) Appl. No.: 13/339,925

(22) Filed: Dec. 29, 2011

(65) Prior Publication Data
US 2013/0049003 A1    Feb. 28, 2013

(30) Foreign Application Priority Data

Aug. 30, 2011    (KR) .................. 10-2011-0087327

(51) Int. Cl.
*H01L 27/32* (2006.01)
*H01L 51/52* (2006.01)

(52) U.S. Cl.
CPC ........ *H01L 27/3276* (2013.01); *H01L 51/5246* (2013.01); *H01L 27/3246* (2013.01)

(58) Field of Classification Search
CPC .................................. H01L 27/3246
USPC ........................................... 257/72
See application file for complete search history.

(56) References Cited

U.S. PATENT DOCUMENTS

| 8,026,511 B2 | 9/2011 | Choi et al. |
| 2006/0061268 A1* | 3/2006 | Nakanishi ............... 313/506 |
| 2009/0261712 A1 | 10/2009 | Choi et al. |
| 2011/0043495 A1 | 2/2011 | Bang et al. |

FOREIGN PATENT DOCUMENTS

| CN | 101009310 A | 8/2007 |
| JP | 2011-044417 | 3/2011 |
| KR | 20080062899 A | 7/2008 |
| KR | 20100013879 A | 2/2010 |
| KR | 1020110071646 A | 6/2011 |

OTHER PUBLICATIONS

Notice of Allowance issued in Chinese Patent Application No. 201110456846.2, mailed Nov. 15, 2014, 6 pages.
Notice of Allowance issued in Korean Patent Application No. 10-2011-0087327, mailed Sep. 22, 2014, 6 pages.

* cited by examiner

*Primary Examiner* — Matthew Reames
(74) *Attorney, Agent, or Firm* — Brinks Gilson & Lione (57) ABSTRACT

An OLED device is disclosed. The OLED device includes: a substrate defined into an active area in which a plurality of pixels are formed in a matrix shape, a GIP (gate-in-panel) area in which drive elements are formed, a ground contact area, and a seal line area; a thin film transistor formed in each pixel region within the active area; an organic light emission diode formed on a protective film and configured to include a first electrode, an organic light emission layer and a second electrode; a bank layer formed to divide the organic light emission diode into pixel units; a signal wiring formed in the ground contact area and the seal line area; and an extended portion formed from the same material as the first electrode of the organic light emission diode and configured to cover the signal wiring.

18 Claims, 9 Drawing Sheets

ORGANIC LIGHT EMITTING DISPLAY DEVICE AND METHOD FOR MANUFACTURING THE SAME

This application claims the priority and the benefit under 35 U.S.C. §119(a) on Korean Patent Application No. 10-2011-0087327 filed on Aug. 30, 2011, the entire contents of which are hereby incorporated by reference.

BACKGROUND

1. Field of the Invention

This disclosure relates to an organic light emitting display (OLED) device and a method of manufacturing the same.

2. Discussion of the Related Art

Image display devices used for displaying a variety of information on a screen are one of the core technologies of the information and communication era. Such image display devices have been being developed to be thinner, lighter, and more portable, and furthermore to have a high performance. Actually, flat panel display devices are spotlighted in the display field due to their reduced weight and volume, well known disadvantages of cathode ray tubes (CRTs). The flat panel display devices include OLED devices, which display images by controlling the light emitting quantity of an organic light emission layer.

The OLED devices are self-illuminating display devices employing a thin light emission layer between electrodes. As such, the OLED devices can become thinner like a paper. Such OLED devices display images by emitting light through an encapsulated substrate. The encapsulated substrate includes a plurality of pixels arranged in a matrix shape and each configured with 3 colored (i.e., red, green and blue) sub-pixels, a cell driver array, and an organic light emission array.

In order to realize a variety of colors, the OLED device employs organic light emission layers, which are configured to emit red, green and blue lights, respectively. The organic light emission layer is interposed between two electrodes and used to form an organic light emission diode.

Figure 1:
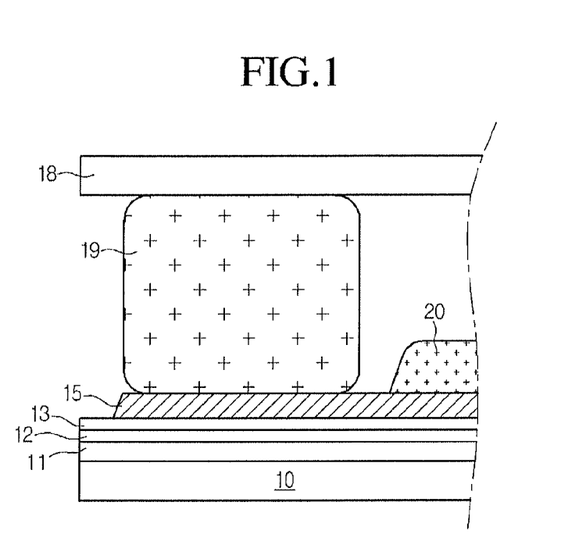
FIG. 1 is a cross-sectional view showing a seal region of the OLED device according to the related art.

FIG. 1 is a cross-sectional view showing a seal region of the OLED device according to the related art.

As shown in FIG. 1, the OLED device is defined into an active area on which a plurality of pixels each including an organic light emission diode are arranged, and a pad area in which drive elements or power supply wirings are formed along the outline of the active area. A seal line area occupying edges of the pad area is included. In the seal line area, a sealant used for combining an array substrate provided with the organic light emission diodes with an upper substrate 18 is disposed.

The array substrate of the OLED device includes a buffer layer 11, a gate insulation layer 12 and an interlayer insulation film 13 stacked on a lower substrate 10. The array substrate further includes signal wirings 15 formed on the interlayer insulation film 13. The signal wirings 15 may be used for forming either the power supply wirings with a ground wiring or the drive elements. A reference number "20", which is inserted in the drawing but not explained, indicates a bank layer. The bank layer 20 is used for not only defining the pixel regions within the active area but also forming the organic light emission diodes.

When the elements such as thin film transistors and the organic light emission diodes are formed on the lower substrate 10 as described above, a seal line 19 is formed along edges of the lower substrate in such a manner as to be across the signal wirings 15 (or the power wirings). Then, the upper and lower substrates 20 and 10 are combined with each other.

As shown in the drawing, a protective film, which had been formed on the signal wiring 15 is removed in order to reduce a number of processes. In other words, the protective film formation process is removed from the recent manufacturing process of an OLED device. However, due to this, a stained fault is generated in an area in which the seal line 19 and the signal wiring 15 are disposed.

Figure 2:
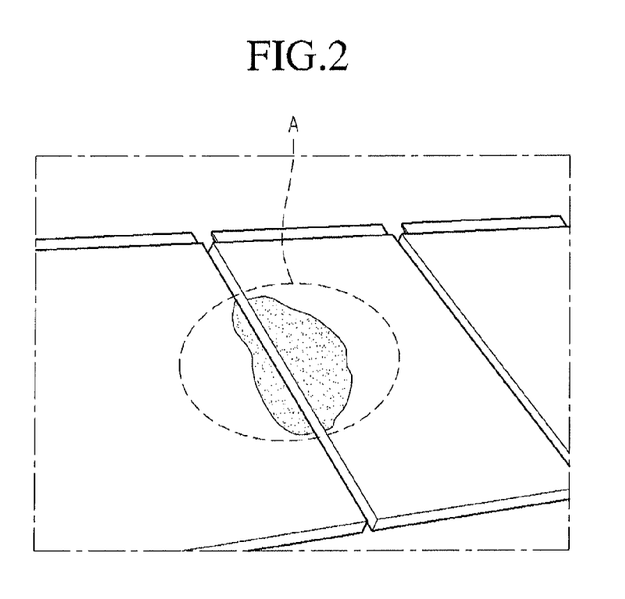
FIG. 2 is a photographic view showing a stained fault which is generated in a seal line area of the OLED device according to the related art.

FIG. 2 is a photographic view showing a stained fault, which is generated in the seal line area of the OLED device according to the related art. Referring to FIG. 2, it is seen that a stained fault is generated in an area A, which includes the seal line 19 formed on the signal wiring 15.

In other words, the stained fault which had been not generated in the case that the related art protective film is formed on the thin film transistor region of the active area and the signal wiring region of the pad area, is caused by removing the protective film formation process.

However, it is necessary to reduce a number of manufacturing processes by removing the protective film formation process, in order to provide high productivity and the cost reduction for the OLED device. Therefore, a new technology adapted to reduce a number of processes and prevent the stained fault must be developed.

BRIEF SUMMARY

According to one general aspect of the present embodiment, an OLED device includes: a substrate defined into an active area in which a plurality of pixels are formed in a matrix shape, a GIP (gate-in-panel) area in which drive elements are formed, a ground contact area, and a seal line area; a thin film transistor formed in each pixel region within the active area; an organic light emission diode formed on a protective film and configured to include a first electrode, an organic light emission layer and a second electrode; a bank layer formed to divide the organic light emission diode into pixel units; a signal wiring formed in the ground contact area and the seal line area; and an extended portion formed from the same material as the first electrode of the organic light emission diode and configured to cover the signal wiring, wherein a seal line within in the seal line area is formed on an edge of the signal wiring, which is covered with the extended portion, and an interlayer insulation film adjacent to the edge of the signal wiring.

An OLED device manufacturing method according to another general aspect of the present embodiment includes: preparing a substrate defined into an active area in which a plurality of pixels will be formed in a matrix shape, a GIP (gate-in-panel) area in which drive elements will be formed, a ground contact area, and a seal line area; forming a thin film transistor, which is configured with a channel layer, a gate insulation film, a gate electrode, and source and drain electrodes, in each pixel region within the active area as well as a signal wiring on an interlayer insulation film corresponding to the seal line area and the ground contact area; forming a protective film on the substrate provided with the thin film transistor, and exposing a part of the drain electrode of the thin film transistor and the signal wiring through a contact hole formation process; and forming an organic light emission diode, which is configured with a first electrode, an organic light emission layer and a second electrode, on the substrate provided with the protective film, wherein an extended portion is formed to cover the signal wiring at the formation of the first electrode.

An OLED device according to still another general aspect of the present embodiment includes: a substrate defined into an active area in which a plurality of pixels will be formed in a matrix shape, a GIP (gate-in-panel) area in which drive elements will be formed, a ground contact area, and a seal line area; a thin film transistor formed in each pixel region within the active area; an organic light emission diode configured to include a first electrode, an organic light emission layer and a second electrode and formed on a protective film which is provided to cover the thin film transistor; a bank layer formed to divide the organic light emission diode into pixel units; a signal wiring formed in the ground contact area and the seal line area; and a seal line formed in the seal line area, wherein the signal wiring is formed in the same layer as a gate electrode of the thin film transistor between a gate insulation film and an interlayer insulation film, and the seal line opposite to the signal wiring is formed on the interlayer insulation film which is formed to cover the signal wiring.

An OLED device manufacturing method according to further still another general aspect of the present embodiment includes: preparing a substrate defined into an active area in which a plurality of pixels will be formed in a matrix shape, a GIP (gate-in-panel) area in which drive elements will be formed, a ground contact area, and a seal line area; forming a thin film transistor, which is configured with a channel layer, a gate electrode, and source and drain electrodes, in each pixel region within the active area as well as a signal wiring on a gate insulation film corresponding to the seal line area and the ground contact area at the formation of the gate electrode; forming a protective film on the substrate provided with the thin film transistor, and exposing a part of the drain electrode of the thin film transistor; forming an organic light emission diode, which is configured with a first electrode, an organic light emission layer and a second electrode, on the substrate provided with the protective film; and forming a seal line on an interlayer insulation film, which is formed to cover the signal wiring, within the seal line area and in direct contact with the interlayer insulation film.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION OF THE DRAWINGS AND THE PRESENTLY PREFERRED EMBODIMENTS

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. In the drawings, the size, thickness and so on of a device can be exaggerated for convenience of explanation. Wherever possible, the same reference numbers will be used throughout this disclosure including the drawings to refer to the same or like parts.

Figure 3:
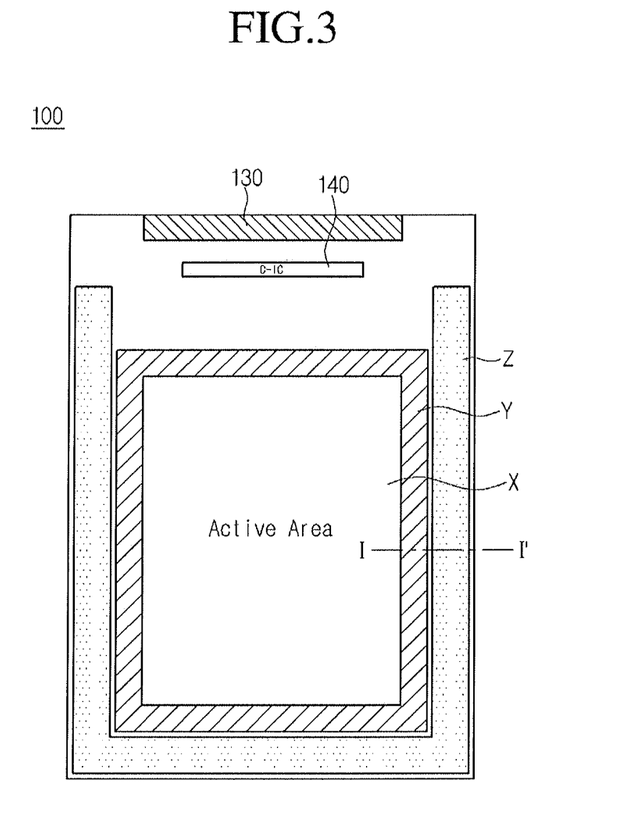
FIG. 3 is a planar view showing the structure of an OLED device according to an embodiment of the present disclosure.
Figure 4:
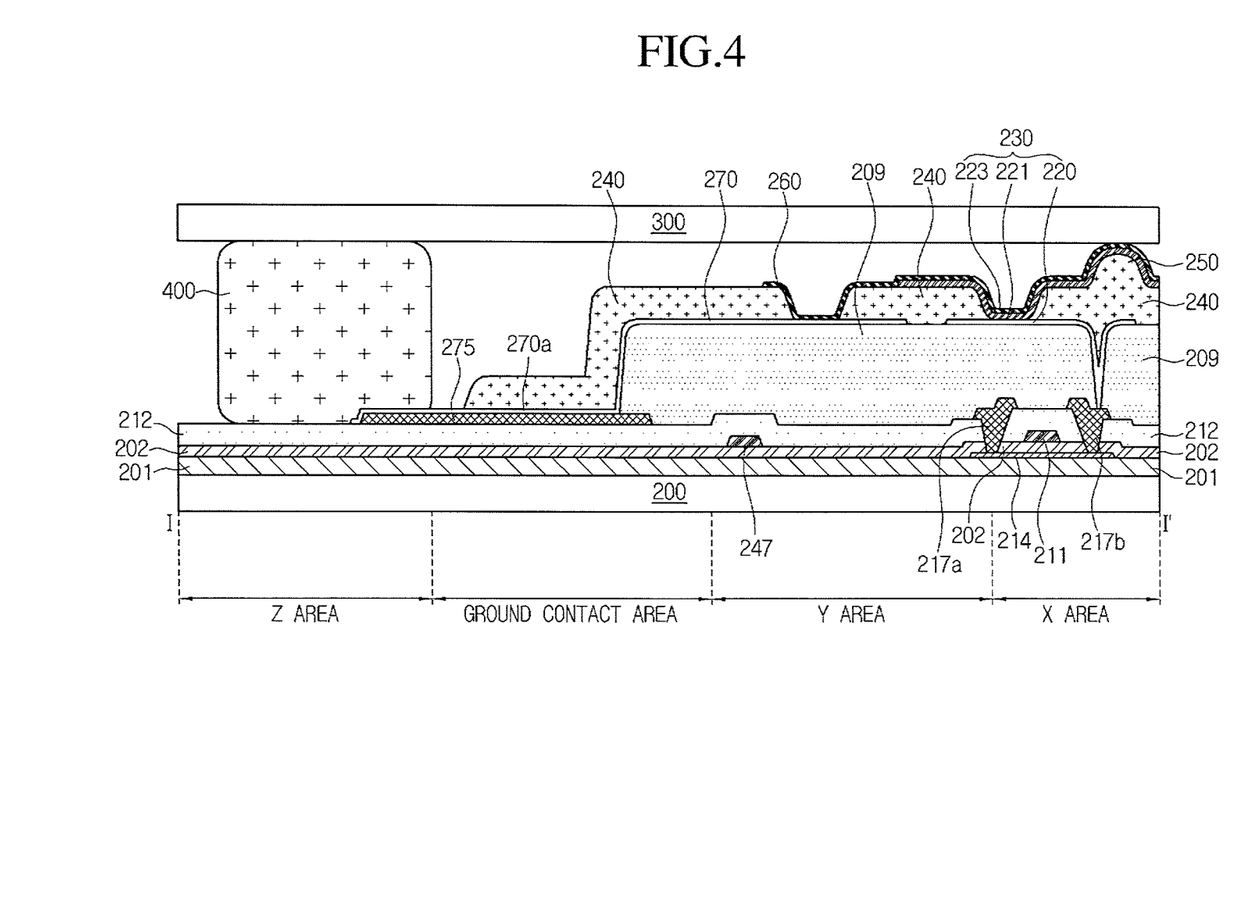
FIG. 4 is a cross-sectional view showing the OLED device taken along a line I-I' in FIG. 3.

FIG. 3 is a planar view showing the structure of an OLED device according to an embodiment of the present disclosure. FIG. 4 is a cross-sectional view showing the OLED device taken along a line I-I' in FIG. 3.

Referring to FIGS. 3 and 4, the OLED device 100 can be defined into an active area (an X area), a seal line area (a Z area) and a GIP (Gate-In-Panel) area (a Y area). The active area (X area) can be defined into a plurality of pixel regions arranged in a matrix shape. An organic light emission diode 230 and a thin film transistor TFT are formed in each of the pixel regions. The seal line area (Z area) occupying edges of the OLED device 100 is used for combining a lower substrate 200 with an upper substrate 300. The GIP area (Y area) is positioned between the active area (X area) and the seal line area (Z area). Gate drive circuit elements are formed in the GIP area (Y area).

A pad area 130 and a data driver area 140 can be provided in an edge of the OLED device 100. The pad area 130 is used for electrical connections with external signal connectors (not shown).

As shown in the drawings, a ground contact area positioned between the GIP area (Y area) and the seal line area (Z area) can be further included in the OLED device 100. Signal wirings 275 for ground connections are formed on the ground contact area. The signal wirings 275 are in electrical contact with the elements within the GIP area (Y area).

In the detailed structure of the OLED device according to an embodiment of the present disclosure, the thin film transistor TFT is formed in the active area (X area) of the lower substrate 200. The thin film transistor TFT is configured with a channel layer 214 formed on a buffer layer 201 which is formed on the lower substrate 200, a gate electrode 211 formed on a gate insulation film 202 which is formed to cover the channel layer 214, and source and drain electrodes 217a and 217b configured to contact source and drain regions of the channel layer 214 through contact holes which are formed with having the gate electrode 211 therebetween.

Also, the organic light emission diode 230 is formed over the thin film transistor TFT. The organic light emission diode 230 is configured with a first electrode (an anode) 220, an organic light emission layer 221 and a second electrode (a cathode) 223 sequentially formed opposite the thin film transistor TFT with having a protective film 209 therebetween. The protective film 209 is formed from an organic material.

The organic light emission diode 230 is divided into pixel units by a bank layer 240. The bank layer 240 is used for defining the plurality of pixel regions.

In order to reduce a number of mask processes, an embodiment of the present disclosure forces the bank layer 240 and a spacer 250 to be formed in a single body using a single mask such as a half-tone mask or a diffractive mask.

Similarly to the active area (X area), the buffer layer 201 and the gate insulation film 202 are also formed on the lower substrate 200 corresponding to the GIP area (Y area), the ground contact area and the seal line area (Z area). Moreover, a plurality of drive elements (not shown) and a power supply wiring 247 is formed on the gate insulation film 202 corresponding to the GIP area (Y area).

Also, the protective film 209 is formed on the lower substrate where the plurality of drive elements are formed. A first connection electrode 270 positioned at the same layer as the first electrode 220 and a second connection electrode 260 extended from the second electrode 223 are sequentially formed on the protective film 209. The first and second connection electrodes 270 and 260 are used for grounding the second electrode 223 of the organic light emission diode 230 within the active area (X area).

The first and second connection electrodes 270 and 260 are in electrical contact with each other through a contact hole, which is formed in the bank layer 240. An extended portion 270a is formed to extend from the first connection electrode 270 to the seal line area (Z area) and electrically contact a signal wiring 275. The signal wiring 275 can become a ground wiring. The extended portion 270a configured to extend from the first electrode 270 completely covers the signal wiring 275 which is formed on the interlayer insulation film 212 corresponding to the ground contact area and the seal line area (Z area).

A seal line 400 is formed on the signal wiring 275 covered with the extended portion 270a.

In this manner, the OLED device according to an embodiment of the present disclosure enables the signal wiring 275 formed in the seal line area (Z area) and the ground contact area to be covered with the extended portion 270a, which is formed to extend from the first connection electrode 270 at the formation of the first electrode 220 of the organic light emission diode 230, instead of the protective film. As such, the seal line 400 directly contacts the extended portion 270a. In other words, the seal line 400 contacts the extended portion 270a with a superior adhesive property. In accordance therewith, the combining characteristic of the lower and upper substrates 200 and 300 can be enhanced.

Also, the OLED device according to an embodiment of the present disclosure forces the signal wiring 275 to be positioned in an inner direction from the center of the seal line 400 toward the center of the lower substrate 200. As such, the seal line 400 contacts the interlayer insulation film 212, adjacent to the signal wiring 275, and the extended portion 270a covering the signal wiring 275. In accordance therewith, the deterioration fault of the organic light emission diode 230 due to the intrusion of moisture can be prevented.

FIGS. 5A to 5D are cross-sectional views illustrating a method of manufacturing an OLED device according to an embodiment of the present disclosure.

Referring to FIGS. 5A through 5D, a buffer layer 201 is formed on a lower substrate 200 which is defined into an active area (X area), a GIP area (Y area), a ground contact area, and a seal line area (Z area).

Figure 5A:
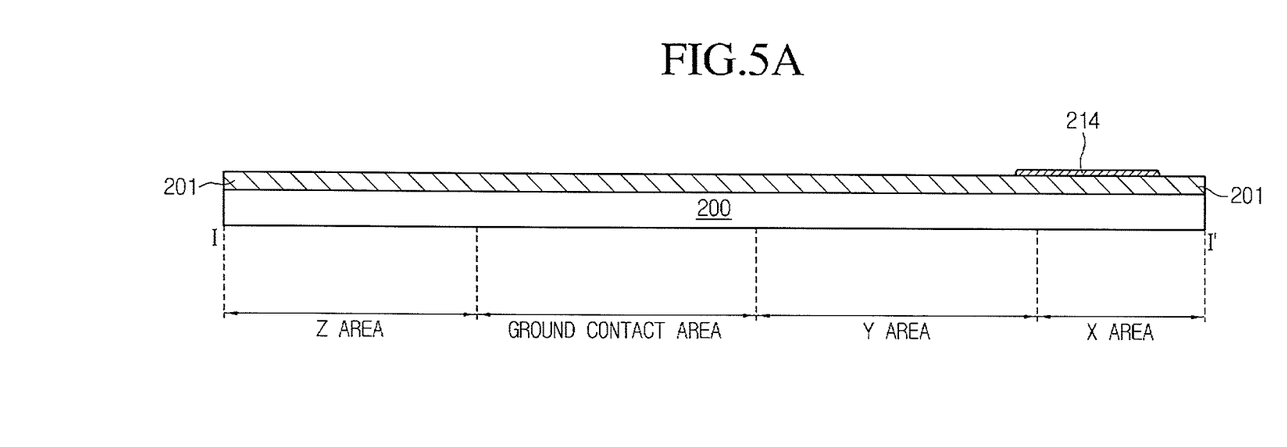
FIGS. 5A to 5D are cross-sectional views illustrating a method of manufacturing an OLED device according to an embodiment of the present disclosure.
Figure 5B:
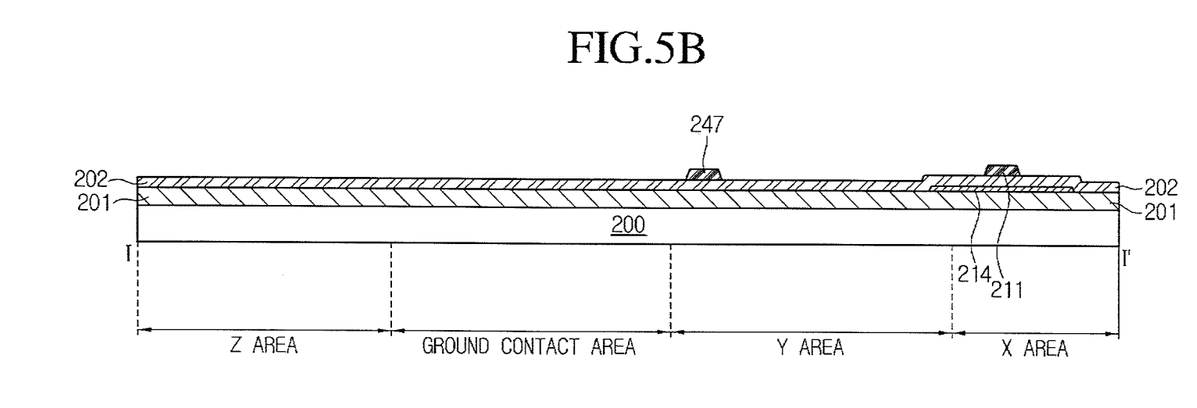

As an example of the lower substrate 200, an insulated glass, plastic, or conductive substrate can be used. The buffer layer 201 can be formed from either an organic insulation material such as polyimide, photoacrylic and so on, or an inorganic insulation material such as $SiN_x$ and $SiO_2$.

A thin film transistor TFT of the top-gate type is formed in the active area (X area). In order to form the thin film transistor TFT, a channel layer 214 is formed on the buffer layer 201. The channel layer 214 includes a channel region and source/drain regions doped with impurities. An gate insulation film 202 is formed on the entire surface of the lower substrate 200 provided with the channel layer 214.

The channel layer 214 can be prepared by forming an amorphous silicon layer on the buffer layer 201 and crystallizing the amorphous silicon into a crystalline silicon layer through a heat treatment process. The gate insulation film 202 can be formed from an inorganic insulation material such as silicon nitride $SiN_x$, silicon oxide $SiO_x$ and so on. Also, the gate insulation film 202 can include either a single layer formed from one of the inorganic insulation materials, or multiple layers formed from different inorganic insulation materials.

After the above-mentioned gate insulation film 202 is formed on the lower substrate 200, a gate electrode 211 is formed on the gate insulation film 202 opposite to the channel layer 214. The gate electrode 211 can be prepared by forming a metal film on the entire area of the lower substrate 200 and patterning the metal film through a mask process.

At the same time, a power supply wiring 247 and other gate electrodes of transistors included in a plurality of drive elements, which are not shown in the drawings, are formed on the GIP area (Y area) of the lower substrate 200 (more specifically, on the gate insulation film 202 corresponding to the GIP area (Y area)).

Meanwhile, the buffer layer 201 and the gate insulation film 202 are stacked on the lower substrate 200 corresponding to the seal line area (Z area) and the ground contact area.

Figure 5C:
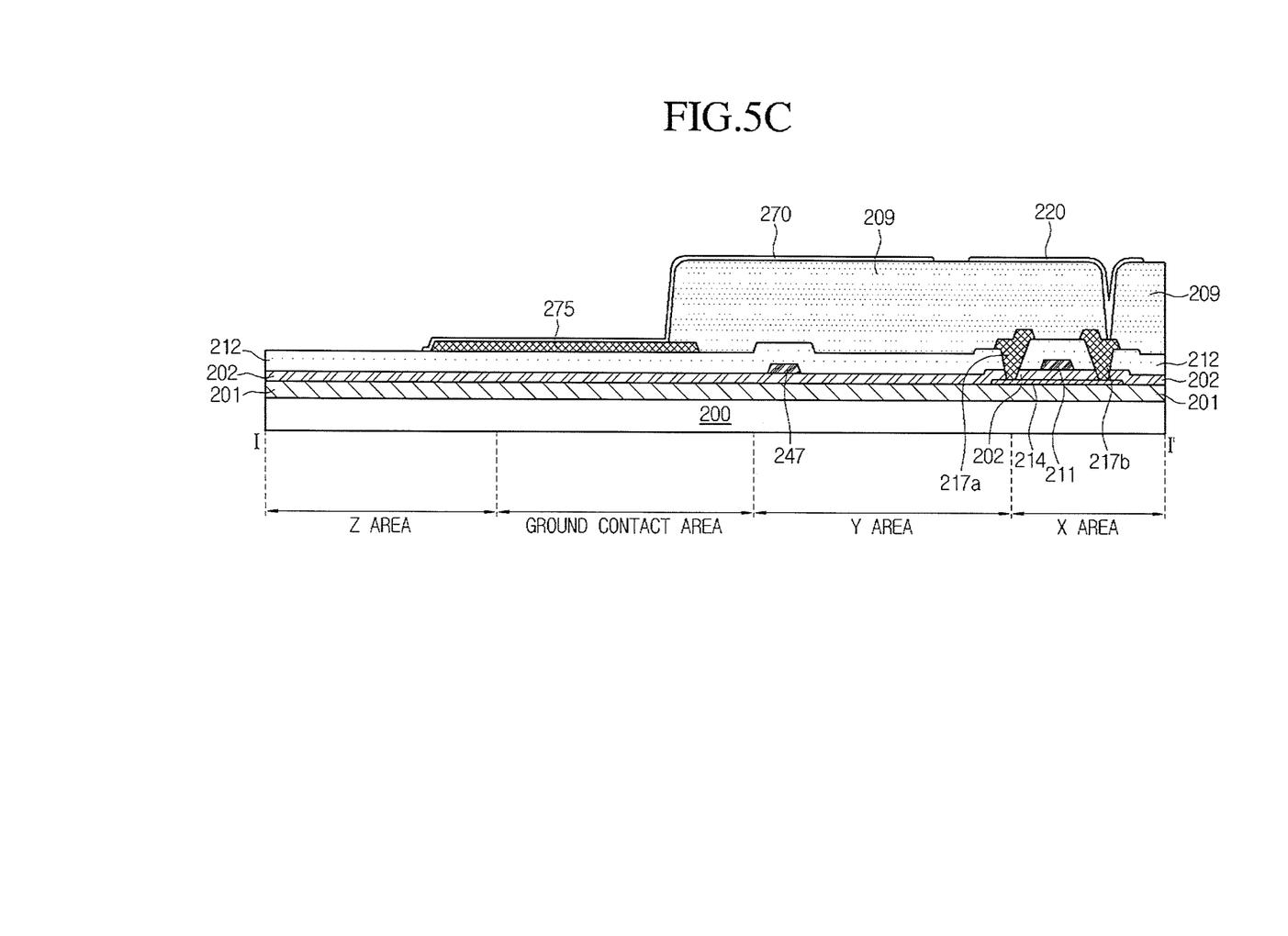

As shown in FIG. 5C, an interlayer insulation film 212 is formed on the entire surface of the lower substrate 200 and contact holes are formed in the interlayer insulation film 212 opposite to the source/drain regions of the channel layer 214 through a contact hole formation process, after the formation of the above-mentioned gate electrode 211 and so on.

Thereafter, the thin film transistor is completed by forming source/drain electrodes 217a and 217b which are being in electrical contact with the source/drain regions of the channel layer 214, respectively. The source/drain electrodes 217a and 217b are formed by depositing a source/drain metal film on the entire surface of the lower substrate 200 and patterning the source/drain metal film through another mask process.

The source/drain metal film can be formed in either a single layer or a structure of multiple layers, formed from copper Cu, aluminum Al, aluminum alloy AlNd, molybdenum Mo, chrome Cr, titanium Ti, tatalium Ta, molybdenum-tungsten MoW, alloys thereof, and so on.

At the same time, signal wirings 275 are formed on the interlayer insulation film 212 corresponding to the seal line area (Z area) and the ground contact area. Data lines and source/drain electrodes of transistors, which are not shown in the drawings, are also formed in the interlayer insulation film 212 corresponding to the GIP area (Y area).

After the above-mentioned thin film transistor TFT is completed, a protective film 209 is formed on the entire surface of the lower substrate 200. Still another mask process is performed for the protective film 209 so that a contact hole is formed in the protective film 209 opposite to the drain electrode 217b and the signal wirings formed in the seal line area (Z area) and the ground contact area are externally exposed.

The protective film 209 can be formed from either an inorganic insulation material or an organic insulation material such as BCB (benzocyclobutene), an acrylic-based resin, PFCB, or others. Also, the protective film 209 can be formed by applying one of the above-mentioned materials through a spin coating method and so on.

Figure 5D:
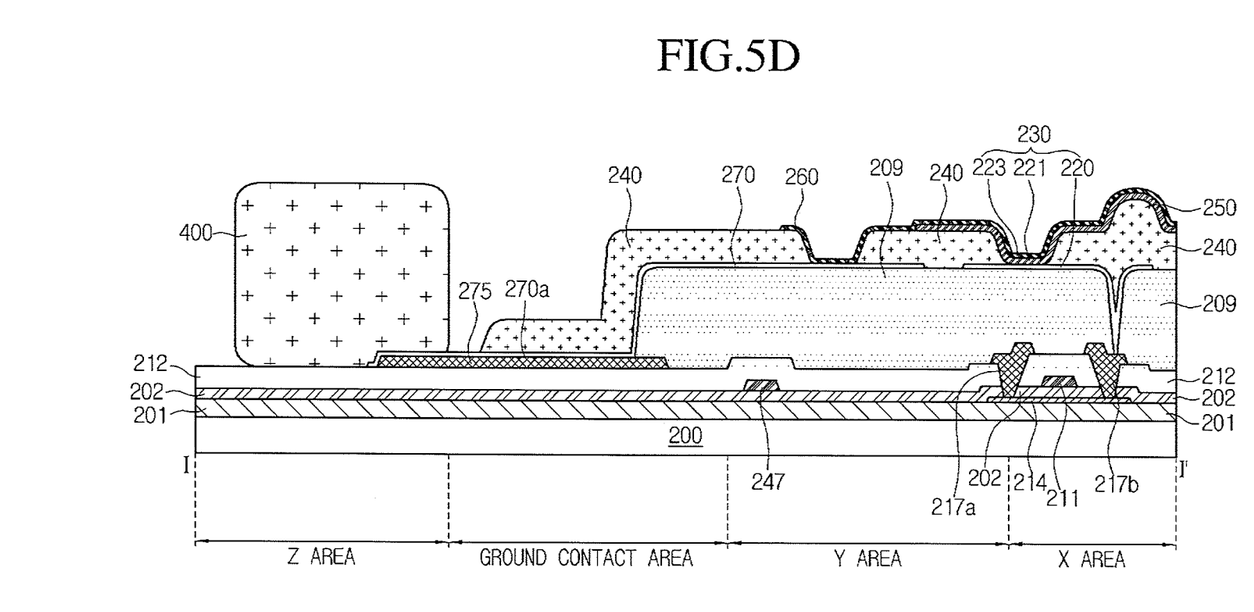

Afterward, a first electrode 220 for an organic light emission diode 230 is formed on the protective film 209 in such a manner as to electrically contact the drain electrode 217b of the thin film transistor TFT. The first electrode 220 of the organic light emission diode 230 is prepared by forming a metal film on the entire surface of the above-mentioned lower substrate 200 and patterning the metal film through further still another mask process.

The first electrode 220 can be formed from a transparent conductive material such as ITO (indium tin oxide), TO (tin oxide), IZO (indium zinc oxide), ITZO (indium tin zinc oxide), or others. Alternatively, the first electrode 220 can be formed with a structure of double or triple layers including a metal film such as a silver film.

When the first electrode 220 is formed, a first connection electrode 270 and an extended portion 270a configured to extend from the first electrode to the seal line area (Z area) are simultaneously formed in the GIP area (Y area), the ground contact area and the seal line area (Z area). The first connection electrode 270 and the extended portion 270a are formed in a single body united with each other and from the same material.

According to the manufacturing method of the present embodiment, the extended portion 270a is formed to completely cover the signal wirings 275 which is externally exposed by removing the protective film 209. As such, the signal wirings 275 can be screened from the exterior by the extended portion 270a.

After the above-mentioned first electrode 220 is formed, a bank layer 240 for defining a formation area of the organic light emission diode 230 into pixel units and a spacer 250 are formed in a single bode united with each other. The bank layer 240 and the spacer 250 can be prepared by forming an organic film on the entire surface of the above-mentioned lower substrate 200 and patterning the organic film using either a half-tone mask or a diffractive mask.

More specifically, the organic film is formed to have a thickness corresponding to the height of the spacer 250. Also, the organic film is patterned by allowing a semi-transmission region of the half-tone mask or a diffractive pattern of the diffractive mask to be opposite the bank layer 240, a non-transmission region of the half-tone mask or diffractive mask to be opposite the spacer 250, and a transmission region of the half-tone mask or the diffractive mask to be opposite a region of the first electrode 220 which will be exposed.

Thereafter, an organic light emission layer 221 and a second electrode 223 are sequentially formed on the exposed portion of the first electrode 220. In accordance therewith, the organic light emission diode 230 is completed.

In other words, the bank layer 240 defines the active area (X area) of the OLED device 100 into pixel units. Red, green, blue, or white organic light emission layer 221 can be formed in each of the pixel regions.

A reference number "260", which is inserted in the drawings but not explained, indicates a second connection electrode. The second connection electrode 260 is formed in a single body united with the second electrode 223. Also, the second connection electrode 260 comes in electrical contact with the first connection electrode 270, which is formed under the bank layer in the GIP area (Y area).

After the above-mentioned organic light emission diode 230 is formed on the lower substrate 200, a seal line 400 is formed on the lower substrate 200 corresponding to the seal line area (Z area), and then an upper substrate 300 is combined with the lower substrate 200. In accordance therewith, the OLED device is completed.

Particularly, the OLED device manufacturing method of the present embodiment forces the seal line 400 to be formed on edges of the signal wiring 275 and the extended portion 270a as well as the interlayer insulation film 212 adjacent to the signal wiring 275. As such, the signal wiring 275 is not exposed to the exterior unlike that of the related art.

Moreover, the seal line 400 directly contacts the extended portion 270a covering the signal line 275 without being in direct contact with the signal wiring 275. As such, the contacting property of the seal line 400 can be enhanced compared to when it is in contact with the signal wiring 275.

In this way, the OLED device manufacturing method of the present embodiment forces the signal wirings formed along outlines of the active area to be covered with the extended portion, which is formed from a metal material. As such, the OLED device can prevent external moisture intrusion.

Also, the OLED device manufacturing method of the present embodiment forces edges of the signal wiring 275 and the extended portion 270a to be positioned in an inner direction of the OLED device 100 tending from the center of the seal line 400 within the seal line area (Z area) toward the active area (X area). In accordance therewith, a deterioration phenomenon of the organic light emission diode 230, which can be caused by moisture intrusion, can be prevented.

Figure 6:
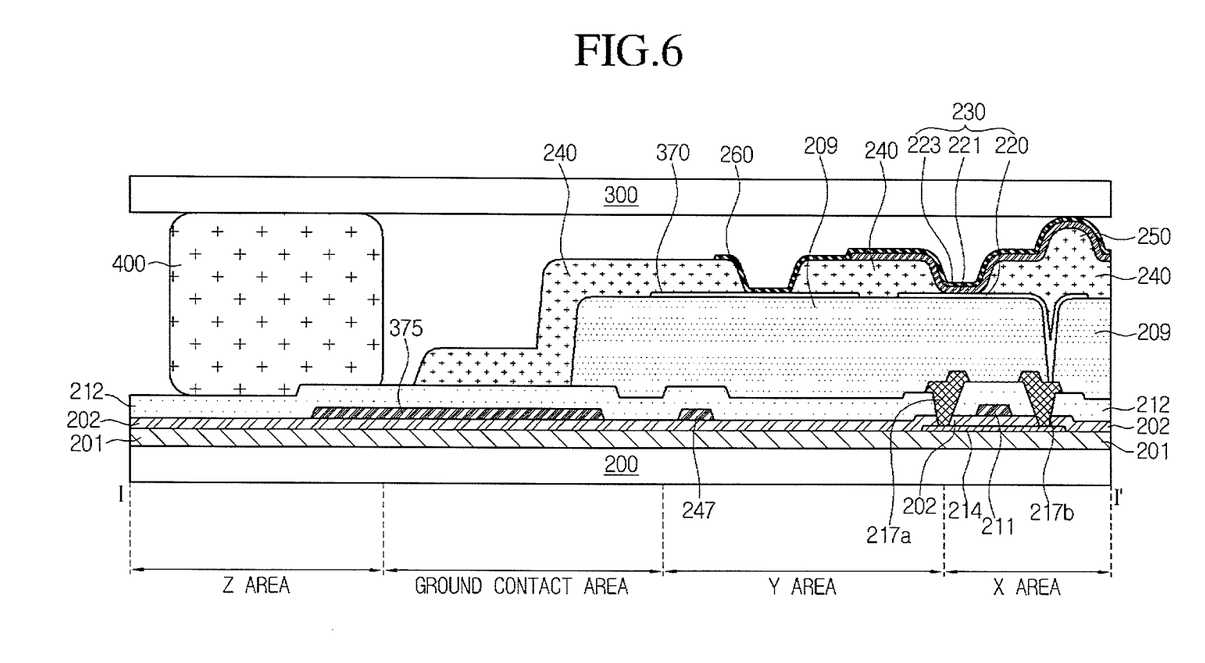
FIGS. 6 and 7 are cross-sectional views showing OLED devices according to other embodiments of the present disclosure.
Figure 7:
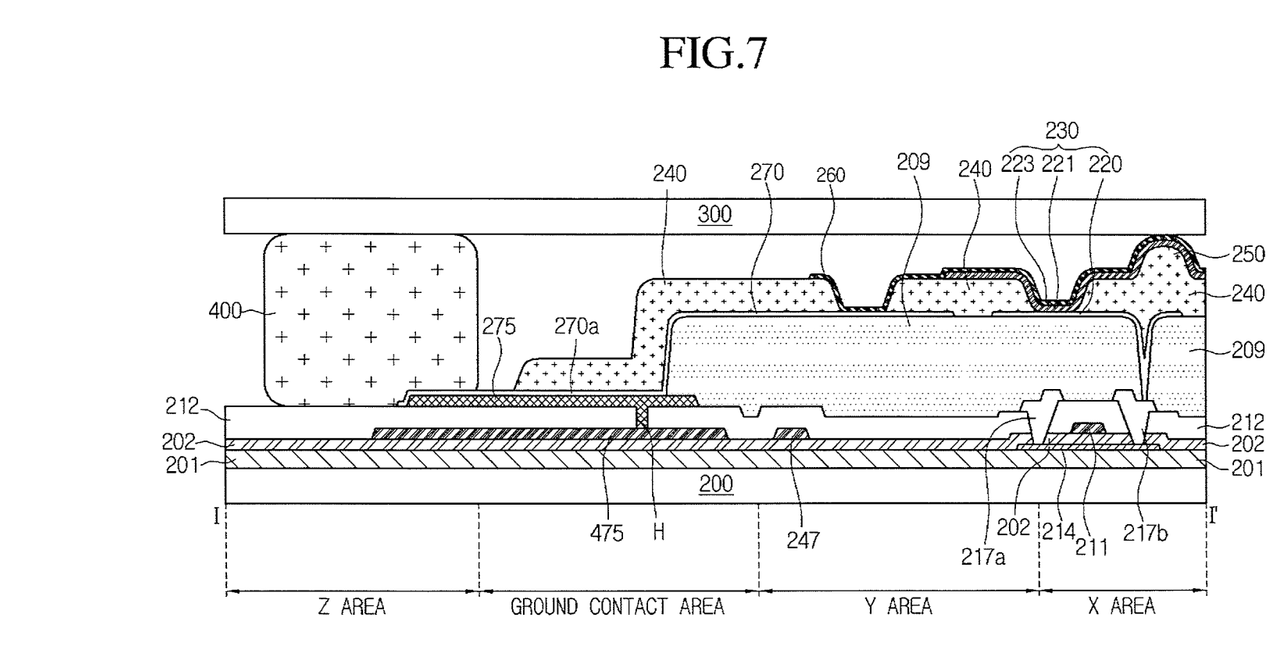

FIGS. 6 and 7 are cross-sectional views showing OLED devices according to other embodiments of the present disclosure. Reference numbers of FIGS. 6 and 7 being the same as those of FIG. 4 correspond to the same components. Therefore, the OLED devices of FIGS. 6 and 7 will be explained in regards to the components, which are distinguished from those of FIG. 4.

Referring to FIG. 6, the OLED device according to another embodiment of the present disclosure can be defined into an active area (X area), a seal line area (Z area), a GIP area (Y area) and a ground contact area. The active area (X area) can be defined into a plurality of pixel regions arranged in a matrix shape. An organic light emission diode 230 and a thin film transistor TFT are formed in each of the pixel regions. The seal line area (Z area) occupying edges of the OLED device 100 is used for combining a lower substrate 200 with an upper substrate 300. The GIP area (Y area) is positioned between the active area (X area) and the seal line area (Z area). Gate drive circuit elements are formed in the GIP area (Y area).

According to another embodiment of the present disclosure, a buffer layer 201, a channel layer 214 and a gate insulation film 202 are sequentially formed on the lower substrate 200, and then a gate electrode 211 is formed on the gate insulation film 202 opposite to the channel layer 214. The gate electrode 211 can be prepared by forming a metal film on the entire surface of the lower substrate 200 with the gate insulation film 202 and patterning the metal film through a mask process.

At the formation of the gate electrode 211, a power supply wiring 247 in the GIP area (Y area) and signal wirings 375 in the seal line area (Z area) and the ground contact area are simultaneously formed.

After the formation of the above-mentioned gate electrode 211 and signal wirings 375, an interlayer insulation film 212 is formed on the entire surface of the lower substrate 200.

When, the above-mentioned interlayer insulation film 212 is formed on the lower substrate 200, contact holes are formed in regions of the interlayer insulation film opposite to source/drain regions of the channel layer 214 through a contact hole formation process. At the same time, still another contact hole can be formed in still another region of the interlayer insulation film 212 opposite to the signal wirings 375. Although it is not shown in the drawing, still another contact hole will be used for bringing a first connection electrode 370 into electrical contact with one of the signal wirings 375 later.

Subsequently, source/drain electrodes 217a and 217b being in electrical contact with the source/drain regions of the channel layer 214 are formed, so that a thin film transistor is completed. The source/drain electrodes 217a and 217b can be prepared by forming a source/drain metal film on the entire surface of the lower substrate 200 with the contact holes and patterning the source/drain metal film through another mask process.

The source/drain metal film can be formed in a single layer or a multi-layer structure. The single layer and the multi-layers can be formed from copper Cu, aluminum Al, aluminum alloy AlNd, molybdenum Mo, chrome Cr, titanium Ti, tatalium Ta, molybdenum-tungsten MoW, alloys thereof, and so on.

After the above-mentioned thin film transistor is completed, a protective film 209 is formed on the entire surface of the lower substrate 200. Still another mask process is performed for the protective film 209 so that a contact hole is formed in the protective film 209 opposite to the drain electrode 217b. Also, another contact hole exposing one of the signal wirings 375 which are formed in the seal line area (Z area) and the ground contact area can be formed through still another mask process.

In other words, the contact hole used for electrically connecting the signal wiring 375 with the first connection electrode 370 is formed when forming another contact hole in the protective film 209, not when forming still another contact holes in the interlayer insulation film 212. When another contact hole is formed in the protective film 209, the contact hole for connecting the signal wiring 375 with the first connection electrode 370 can be formed by sequentially removing regions of the protective film 209 and the interlayer insulation film 212 which are opposite the signal wiring 375.

More specifically, the protective film 209 within the seal line area (Z area) and the ground contact area is removed to expose the interlayer insulation film 212 when another contact hole is formed in the protective film 202. Then, the above-mentioned contact hole exposing a part of the signal wirings 375 can be formed in the interlayer insulation film 212.

The protective film 209 can be formed from either an inorganic insulation material or an organic insulation material such as BCB (benzocyclobutene), an acrylic-based resin, PFCB, or others. Also, the protective film 209 can be formed by applying one of the above-mentioned materials through a spin coating method and so on.

Afterward, a first electrode 220 for an organic light emission diode 230 is formed on the protective film 209 in such a manner as to electrically contact the drain electrode 217b of the thin film transistor TFT. The first electrode 220 of the organic light emission diode 230 is prepared by forming a metal film on the entire surface of the above-mentioned lower substrate 200 and patterning the metal film through further still another mask process.

The first electrode 220 can be formed from a transparent conductive material such as ITO (indium tin oxide), TO (tin oxide), IZO (indium zinc oxide), ITZO (indium tin zinc oxide), or others. Alternatively, the first electrode 220 can be formed with a structure of double or triple layers including a metal film such a silver film.

When the first electrode 220 is formed, the first connection electrode 370 can be simultaneously formed in the GIP area (Y area), the ground contact area and the seal line area (Z area). The first connection electrode 370 is formed from the same material. Such a first connection electrode 370 is formed on the protective film 209 and comes in electrical contact with a second connection electrode 260 which will be formed later.

Thereafter, an organic light emission diode 230, the second connection electrode 260 and a seal line 400 are formed through the same processes as those described in FIG. 4. As such, the detailed description regarding the formation of the organic light emission diode 230, the second connection electrode 260 and the seal line 400 will be omitted to avoid overlapping.

In this manner, another embodiment of the present disclosure forces the signal wirings 375 overlapped with the seal line 400 to be not only formed on the gate insulation film 202 but also completely covered with the interlayer insulation film 212 which is formed later. As such, the seal line 400 comes into direct contact with the upper substrate 300 and the interlayer insulation film 212 of the lower substrate 200. Therefore, the adhesive property of the seal line 400 for the interlayer insulation film 212 can be largely enhanced compared to that for the metal pattern.

Also, another embodiment of the present disclosure makes the signal wirings disposed under the seal line to be formed between the gate insulation film and the interlayer insulation film. In accordance therewith, a deterioration phenomenon of the organic light emission diode, which can be caused by moisture intrusion can be prevented.

Furthermore, another embodiment of the present disclosure allows the signal wirings to be formed under an insulation film (more specifically, under the interlayer insulation film) so that the signal wirings are not exposed to the outside of the seal line area. Therefore, moisture intrusion into the signal wiring area in which the seal line is formed can be prevented.

As shown in FIGS. 3 and 4, the signal wirings 275 can be formed in the seal line area (Z area) and the ground contact area in such a manner as to be positioned in a inner direction from the seal line 400 toward an active area (X area). In this case, the resistance of the signal wiring 275 must increase because of its narrowed width.

To address this matter, still another embodiment of the present disclosure forces an auxiliary signal wiring 475 to be formed on the gate insulation film 202 at the formation of the gate electrode, as shown in FIG. 7. Subsequently, a through hole H is formed in the interlayer insulation film 212 opposite to the auxiliary signal wiring 475 when the contact holes for the source/drain electrodes 217a and 217b are formed in the interlayer insulation film 212. Thereafter, the auxiliary signal wiring 475 comes into electrical contact with a signal wiring 275 via the through hole H when the signal wiring 275 is formed on the interlayer insulation film 212. In accordance therewith, the resistance increment of the signal wiring 275 can be prevented or alleviated.

Also, still another embodiment of the present disclosure covers the signal wiring 275 within the seal line area (Z area) and the ground contact area with an extended portion 270a, which is formed to extend from the a first electrode 220 at the formation of the signal wiring 275, instead of the protective film 209. As such, a seal line 400 comes into direct contact with the extended portion 270a. In other words, the seal line 400 contacts the extended portion 270a with a superior adhesive property. In accordance therewith, the combining characteristic of the lower and upper substrates 200 and 300 can be enhanced.

Moreover, the OLED device according to an embodiment of the present disclosure forces the signal wiring 275 to be positioned in an inner direction from the center of the seal line 400 toward the center of the lower substrate 200. As such, the seal line 400 contacts the interlayer insulation film 212, adjacent to the signal wiring 275, and the extended portion 270a covering the signal wiring 275. In accordance therewith, the deterioration fault of the organic light emission diode 230 due to the intrusion of moisture can be prevented.

Particularly, still another embodiment of the present disclosure can solve the resistance increment of the signal wiring 275 caused by the narrowed width. To this end, the auxiliary signal wiring 475 is formed on the gate insulation film 202 opposite to the signal wiring 275 in such a manner as to be electrically connected to the signal wiring 275.

Although the present disclosure has been limitedly explained regarding only the embodiments described above, it should be understood by the ordinary skilled person in the art that the present disclosure is not limited to these embodiments, but rather that various changes or modifications thereof are possible without departing from the spirit of the present disclosure. Accordingly, the scope of the present disclosure shall be determined only by the appended claims and their equivalents.

The invention claimed is:

1. An organic light emitting display device comprising:
a substrate defined into an active area having a plurality of pixels, a GIP (gate-in-panel) area including drive elements, a ground contact area, and a seal line area;
a thin film transistor formed in each pixel region within the active area and including a channel layer, a gate electrode, and source/drain electrodes;
a gate insulation layer on the channel layer;
an interlayer insulation film on the gate electrode;
a protective film on the thin film transistor and disposed in the active area, the GIP (gate-in-panel) area and a part of the ground contact area;
an organic light emission diode configured to include a first electrode, an organic light emission layer and a second electrode and formed on the protective film;
a signal wiring formed in the ground contact area and the seal line area; and
a seal line formed in the seal line area,
wherein the signal wiring is formed in the same layer as the gate electrode of the thin film transistor between the gate insulation film and the interlayer insulation film, wherein the seal line of the seal line area is on the interlayer insulation film which covers the signal wiring.

2. An organic light emitting display device comprising:
a substrate having a pixel area, a GIP (gate-in-panel) area, a ground contact area, and a seal line area sequentially disposed to a particular direction from a central region of the substrate to an outer side of the substrate;
a protective film on the substrate and disposed from the pixel area to a part of the ground contact area;
an organic light emission diode on a protective film and including a first electrode, an organic light emission layer and a second electrode;
a signal wiring on the ground contact area and the seal line area and delivering signals to the second electrode of the organic light emission diode;
a first connection electrode disposed from the GIP area to a part of the seal line area and covering the signal wiring in the part of the seal line area; and
a seal line on the seal line area and in direct contact with the first connection electrode, the seal line being a single layer of material for bonding the substrate to another substrate.

3. The organic light emitting display device claimed as claim 2, further comprising:
a bank layer dividing the organic light emission diode into pixel units, the bank layer including a main portion and a spacer portion extending upwardly from the main portion,
wherein the spacer portion and the main portion are formed of the same material.

4. The organic light emitting display device claimed as claim 2, wherein the first connection electrode is made the same materials with the first electrode of the organic light emission diode and electrically connects the signal wiring and the second electrode of the organic light emission diode.

5. The organic light emitting display device claimed as claim 2, further comprising an auxiliary signal wiring disposed under the signal wiring and electrically connected to the signal wiring.

6. The organic light emitting display device claimed as claim 2, wherein the first connection electrode comprises a extended portion which directly contacts the signal wiring.

7. The organic light emitting display device claimed as claim 6, wherein the extended portion of the first connection electrode completely covers the signal wiring in the seal line area, wherein the signal wiring is not covered by the protective film.

8. The organic light emitting display device claimed as claim 6, wherein the signal wiring is covered by the extended portion of the first connection electrode.

9. The organic light emitting display device claimed as claim 6, wherein the seal line directly contacts the extended portion without being in direct contact with the signal wiring.

10. An apparatus comprising:
a substrate;
a signal line on the substrate;
a protective layer covering one edge of said signal line;
an organic light emission diode provided on the protective layer;
a connection electrode, covering both said protective layer and said signal line, the connection electrode being in electrical contact with the organic light emission diode and covering said signal line; and
a seal covering a portion of said connection electrode above the other edge of said signal line, the seal being a single layer of material for bonding the substrate to another substrate and in direct contact with the connection electrode.

11. The apparatus of claim 10, wherein said connection electrode is disposed on the signal line and a portion of said signal line is not covered by the protective layer.

12. The apparatus of claim 11, wherein said connection electrode comprises:
a main portion in direct contact with said protective layer, and electrically connected to said organic light emission diode; and
an extended portion extending from said main portion and in direct contact with, electrically connected to, and providing protective coverage to a portion of said signal line, said extended portion extending over said other edge of said signal line and in contact with an interlayer insulation film.

13. The apparatus of claim 12, wherein a portion of said seal is in direct contact with said interlayer insulation film.

14. The organic light emitting display device of claim 1, wherein the signal wiring is overlapped with the seal line and also completely covered with the interlayer insulation film.

15. The organic light emitting display device of claim 1, wherein an adhesive property of the seal line is largely enhanced by directly contacting to the interlayer insulation.

16. The organic light emitting display device of claim 1, wherein the signal wiring are not exposed to the outside of the seal line area to prevent moisture intrusion into the signal wiring area.

17. The organic light emitting display device of claim 1, further comprising:
   a bank layer dividing the organic light emission diode into pixel units; and
   a spacer on the bank layer, wherein the spacer is made of the same material as the bank layer.

18. The organic light emitting display device of claim 1, further comprising:
   a first connection electrode on the protective film; and
   a second connection electrode electrically connected to the first connection electrode and positioned in a single body united with the second electrode of the organic light emission diode.

* * * * *